United States Patent
Zimlin

(10) Patent No.: US 7,187,543 B2
(45) Date of Patent: Mar. 6, 2007

(54) SYSTEM FOR OPTIMAL VIBRATION ISOLATION OF DISK DRIVES IN A DATA STORAGE DEVICE

(75) Inventor: Steve Zimlin, Boulder, CO (US)

(73) Assignee: Copan Systems, Inc., Longmont, CO (US)

(*) Notice: Subject to any disclaimer, the term of this patent is extended or adjusted under 35 U.S.C. 154(b) by 0 days.

(21) Appl. No.: 10/956,248

(22) Filed: Sep. 30, 2004

(65) Prior Publication Data

US 2006/0067060 A1 Mar. 30, 2006

(51) Int. Cl.
H05K 5/00 (2006.01)
F16M 13/00 (2006.01)
A47B 47/00 (2006.01)
A47B 88/00 (2006.01)
G11B 33/02 (2006.01)

(52) U.S. Cl. .......... 361/685; 361/724; 248/634; 248/636; 248/638; 211/187; 211/190; 312/334.7; 312/223.2; 369/75.11; 267/140.5

(58) Field of Classification Search ........ 361/679–687, 361/724–727; 248/633, 634, 636, 638, 560–632; 369/75.1, 75.2, 76, 77.1, 77.2, 78, 79, 80–82; 312/119, 294–348.6, 265.4, 223.1; 211/26
See application file for complete search history.

(56) References Cited

U.S. PATENT DOCUMENTS

| | | | | |
|---|---|---|---|---|
| 4,713,714 A | * | 12/1987 | Gatti et al. | 360/137 |
| 5,209,356 A | * | 5/1993 | Chaffee | 211/26 |
| 5,858,509 A | * | 1/1999 | Polch et al. | 428/166 |
| 6,056,381 A | * | 5/2000 | Turner | 312/351 |
| 6,155,660 A | * | 12/2000 | Nicolai | 312/223.1 |
| 6,578,939 B1 | * | 6/2003 | Mayer | 312/334.5 |
| 6,702,124 B2 | * | 3/2004 | Lauchner et al. | 211/26 |
| 6,891,727 B2 | * | 5/2005 | Dittus et al. | 361/724 |
| 2001/0036399 A1 | * | 11/2001 | Notohardjono et al. | 414/800 |
| 2004/0120106 A1 | * | 6/2004 | Searby et al. | 361/683 |
| 2004/0120123 A1 | * | 6/2004 | Mayer | 361/725 |

OTHER PUBLICATIONS http://www.newport.com/semi/Products/Vibration_Isolation/product.asp?id=2990; NEWPORT/ Vibration Control/ Isolators/ Pneumatic Isolation; © 1996-2004, Newport Corporation pp. 1-8.

* cited by examiner

Primary Examiner—Lisa Lea-Edmonds
Assistant Examiner—Zachary Pape
(74) Attorney, Agent, or Firm—Trellis Intellectual Property Law Group, PC

(57) ABSTRACT

A system for dampening vibrations of a plurality of disk drives in such a way that the packaging density of disk drives is optimized. This is achieved by attaching a device for dampening vibrations to a population set of disk drives. The population set of disk drives comprises a plurality of disk drives. The device for dampening vibrations comprises at least one rail assembly. A plurality of isolators is attached to the rail assembly. The isolators are composed of materials that attenuate vibration. The isolators dampen the vibrations of the population set and isolate the population set from external vibrations and shock.

4 Claims, 5 Drawing Sheets

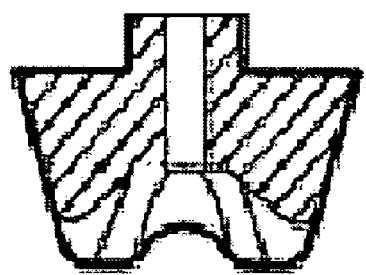
316
FIG. 4B
FIG. 4
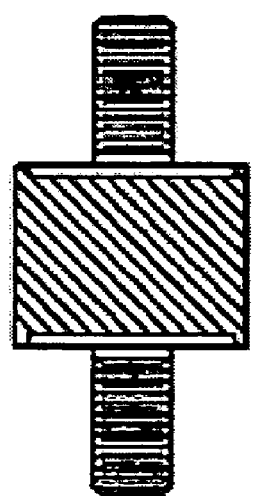
314
FIG. 4A

SYSTEM FOR OPTIMAL VIBRATION ISOLATION OF DISK DRIVES IN A DATA STORAGE DEVICE

BACKGROUND

The present invention relates to the field of disk drives in data storage products, and more particularly to a system and method for optimal vibration dampening in data storage products.

Currently, several data storage products are available which utilize multiple hard disk drives to attain high storage capacities. Packing a large number of disk drives together makes them susceptible to vibrations during shipping, installation, use and operation. Vibrations can be internal or external. Internal vibrations refer to those frequencies that arise from the rotation of disk drives in a data storage device. External vibrations include shock and vibrations due to any other mechanical or electrical instruments such as computers and fans in the vicinity of the data storage device. Shock energy can occur during installation, accidental bumping or pounding of the data storage device. The frequencies of vibrations can range from 5 Hz to 300 Hz.

Packing multiple disk drives into data storage products requires the balancing of several engineering and cost factors, to provide an optimal solution for limiting vibrations in disk drives. Disk drive mounting schemes play an important role in controlling vibration and shock. Such schemes have either rigidly mounted individual drives or isolated individual drives. A rigidly mounted disk drive does not have any dampening material between the individual disk drive and the disk drive enclosure. Therefore, the drive and the drive enclosure act together as a unitary mass, raising the effective inertia of the entire disk drive and reducing the sources of vibration. On the other hand, isolated individual drives provide isolation by incorporating an isolation material between the individual disk drive and the disk drive enclosure. However, neither approach effectively addresses the co-location of hundreds of disk drives. Both approaches are not cost-effective in the case of high-density product implementations. Further, the rigid mounting and individual isolation of each disk drive limits the overall density of a system due to space and thermal constraints.

The ability of high-density data storage products to withstand high shock and vibration levels is becoming increasingly important as the use of redundant array of independent disks (RAID) based, rack-mount systems grow. RAID is a system of disk drives that employs multiple disk drives, in combination, for data storage. A large number of disk drives that spin up and down at different intervals can be co-located in the same rack. This introduces the disk drives in the system or surrounding systems to multiple sources of vibration and operational shock. Vibrations result in the abrasion of mechanical components of disk drives. These components include the heads for reading data and platters. Vibrations also interfere with the operation of disk drives. They can damage a disk drive internally, without showing any external evidence of damage. All such vibrations have to be dampened, to prevent wear and tear of disk drives, premature drive failure, retention of data in disk drives and undue increase in access times.

Prior art systems may take up precious space that could have been utilized for additional disk drives to store more data. There are a few system configurations in which there is an overuse of dampening materials. This blocks the airflow and thus results in heating the system.

SUMMARY

Embodiments of the invention are directed to a system for dampening vibrations in data storage devices.

One embodiment provides a system for the optimal isolation of a population set of disk drives from vibrations.

Another embodiment provides protection to a plurality of population sets from external vibration and shock.

Yet another embodiment serves to isolate a population set of disk drives from vibrations in such a way that the disk drives in the population set are packed with optimal density.

Still another object of the present invention is to enable replacement of individual disk drives from the population set of disk drives, without disturbing other disk drives in the system.

In accordance with one embodiment of the invention, a dampening system comprising two rail assemblies is attached to a population set. A population set comprises a plurality of disk drives. Each rail assembly comprises a plurality of isolators attached to the rail assembly in such a way that they are nearest to the point of attachment of the rail assembly to the population set. The isolators damp out vibrations and shock originating from the population set. A data storage device, that typically is a rack mount, comprises a plurality of population sets. The rail assembly is also attached to the rack in such a way that external vibrations coming from other population sets and external sources, like fans and other devices, are isolated from each population set. The isolators attached to the rail assembly are aligned so that two isolators are aligned vertically and one isolator is aligned horizontally. The vertically aligned isolators dampen system resonance by minimizing rotational vibrations, and the sideways aligned isolators protect the population sets from shock energy that can occur during installation, accidental bumping, pounding, or any other high energy shock. The system is extensible in the horizontal and vertical direction, making it flexible and convenient to use.

Other embodiments of the invention provide advantages in using multiple disk drives and vibration damping where the system occupies minimal space and does not unnecessarily congest the system. Space for additional circuitry and cooling can be provided. Multi-directional isolation of a multiple set of disk drives from vibration and shock is provided.

BRIEF DESCRIPTION OF THE DRAWINGS

The preferred embodiments of the invention will hereinafter be described in conjunction with the appended drawings provided to illustrate and not to limit the invention, wherein like designations denote like elements, and in which:

FIG. 4A is a side view of a vertically aligned isolator in accordance with an embodiment of the present invention; and FIG. 4B is a side view of a sideways-aligned isolator;

DESCRIPTION OF EMBODIMENTS

For the sake of convenience, the terms used to describe the various embodiments are defined below. It should be noted that these definitions are provided to merely aid the understanding of the description, and that they in no way limit the scope of the invention.

Mass Storage Device: The term mass storage device refers to devices and possible techniques for storing large amounts of data in a data storage device. Mass storage devices include all types of disk drives, tape drives, optical, etc.

Disk Drive: A disk drive reads data from and writes data to a disk. The term disk drive includes a hard disk drive (HDD), floppy disk drives, magnetic disk drives, optical disk drives and the like. Disk drives can be located either internally inside a computer or outside a computer in a separate housing that is connected to the computer.

Isolation: The term isolation refers to the vibration dampening of any data storage unit in a mass storage device in such a way that its operation is not affected by vibrations of the neighboring data storage units and other devices capable of interfering with the operation of the data storage unit. The data storage unit includes a disk drive or a set of multiple disk drives.

Vibration dampening: Vibration dampening refers to attenuating frequencies or energy corresponding to the vibrations of a disk drive. The term vibration dampening includes mechanical mounting, physical protection and the physical isolation of disk drives.

Mount: The term mount refers to an apparatus or technique that makes a data storage device available for operation. For example, the term mount includes placing a hard disk into a hard disk drive so that the hard disk is available for operation.

Population Set: The term population set refers to a set of multiple disk drives packaged together in an enclosure.

The present invention relates to isolating mass storage devices from vibration. The present invention may be employed in data storage systems that require fast access of large amounts of data. Other applications of the invention can include any system using devices that are sensitive to vibrations.

Figure 1:
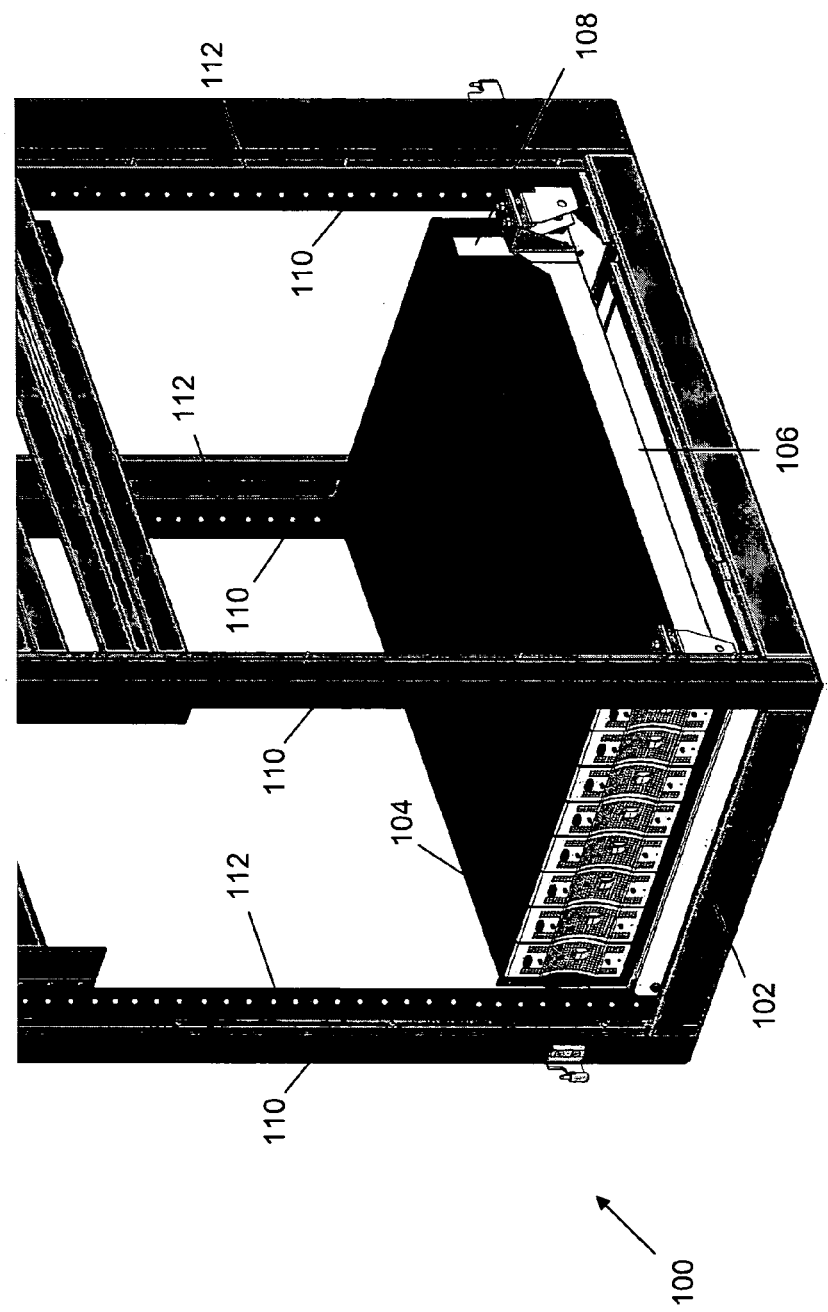
FIG. 1 shows a data storage device in accordance with an embodiment of the present invention.

FIG. 1 shows a data storage device in accordance with an embodiment of the present invention. Data storage device 100 comprises a rack 102. A population set 104 is mounted on rack 102, using rail assemblies 106 for isolating population set 104 from vibrations. Population set 104 comprises a plurality of disk drives. Typically, a population set comprises 60 to 200 disk drives. It will be apparent to one skilled in the art that the number of disk drives in population set 104 can vary, without deviating from the scope of the present invention. Population set 104 is mounted on rack 102, using two rail assemblies 106. The two rail assemblies 106 are placed on opposite faces of population set 104.

In one embodiment of the present invention, multiple population sets 104 can be mounted on rack 102, each population set 104 having two rail assemblies 106. The number of mounted population sets 104 depends on the data storage and data transfer requirements, system architecture and other practical limitations. In this case, the rail assemblies not only isolate the mounted population sets from the rack but also from each other.

In one embodiment of the present invention, a metal strip 108, welded to population set 104 and rail assembly 106, fastens population set 104 to rail assembly 106. In another embodiment of the present invention, metal strip 108 has threaded holes such that screws can be inserted into these holes from within population set 104 and bolted to metal strip 108. This arrangement locks population set 104 with rail assembly 106 into position. It may be apparent to anyone skilled in the art that other means for attaching population set 104 to rail assembly 106 may be used without deviating from the scope of the invention.

Rack 102 comprises four vertical columns 110 to support a plurality of population sets 104. Each column 110 includes holes 112 for attachment to rail assembly 106. According to an embodiment of the present invention, rail assembly 106 is bolted to rack 102. However, the means of attachment should not be limited to bolting. It should be noted that there exist other means of attaching rail assembly 106 with the rack 102 without deviating from the scope of the invention.

Figure 2:
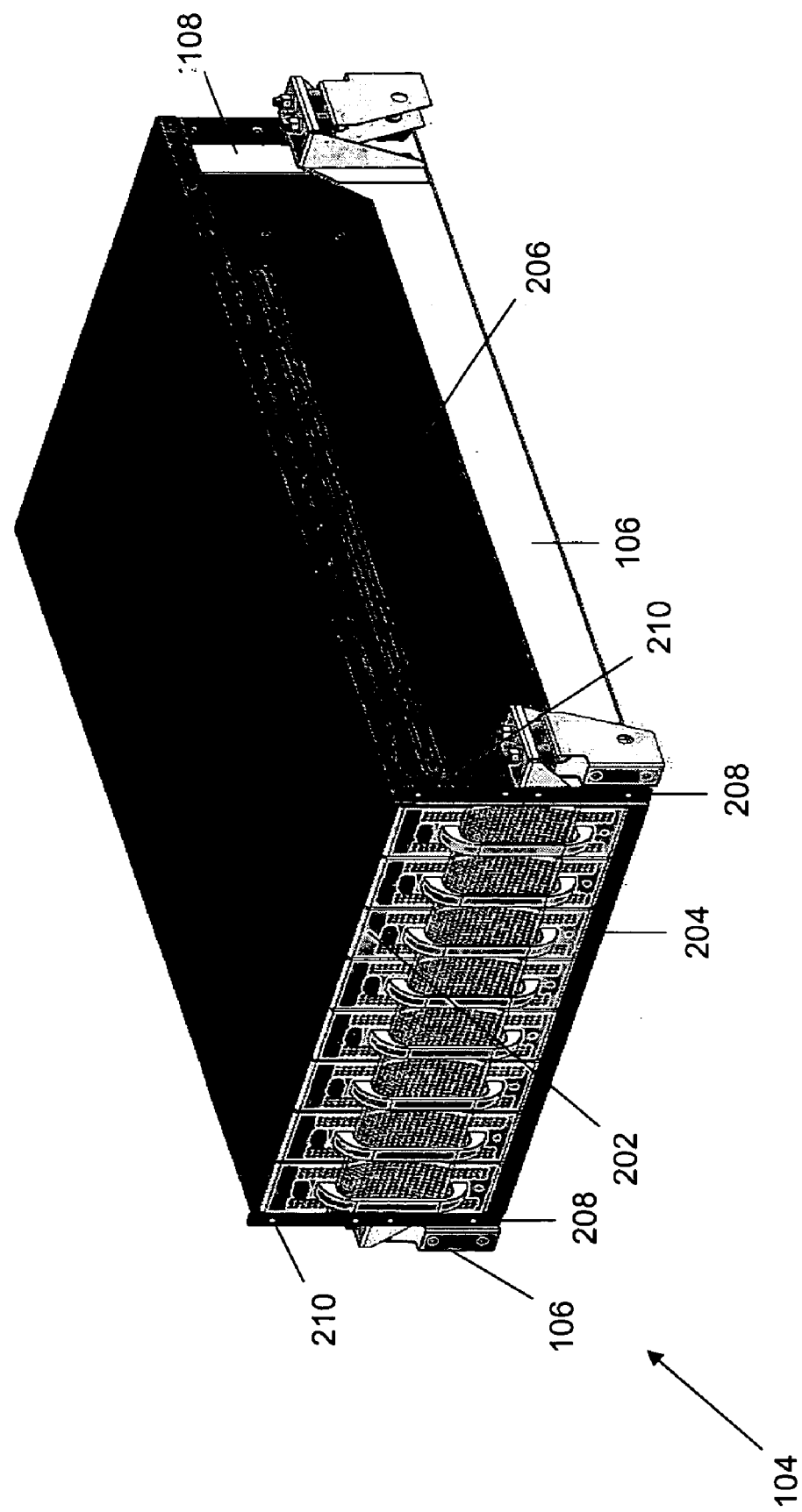
FIG. 2 shows a population set with a rail assembly in accordance with an embodiment of the present invention.

FIG. 2 shows a population set with a rail assembly in accordance with an embodiment of the present invention. Though only one rail assembly 106 is visible in FIG. 2, it will be apparent to anyone skilled in the art that there is a second rail assembly on a side of population set 104 opposite to the side on which rail assembly 106 is attached. Both these rail assemblies isolate population set 104 from rack 102. Population set 104 includes a plurality of removable and serviceable storage modules (RSMs) 202, and related circuitry for delivering power and control to RSMs 202. RSMs 202 and the related circuitry are contained in enclosure 204. RSM 202 further includes a plurality of disk drives and related circuitry for delivering power and control to the disk drives. An exemplary population set 104, described in U.S. patent application Ser. No. 10/680,406, titled "Method and Apparatus of Packaging Disk Drives in Storage System". This patent application is incorporated herein by reference. Rail assemblies 106 are attached to faces 206 of population set 104. Faces 206 are extended laterally outward from population set 104. Lateral extension 208 has a plurality of holes 210 to attach population set 104 to rail assembly 106.

Figure 3A:
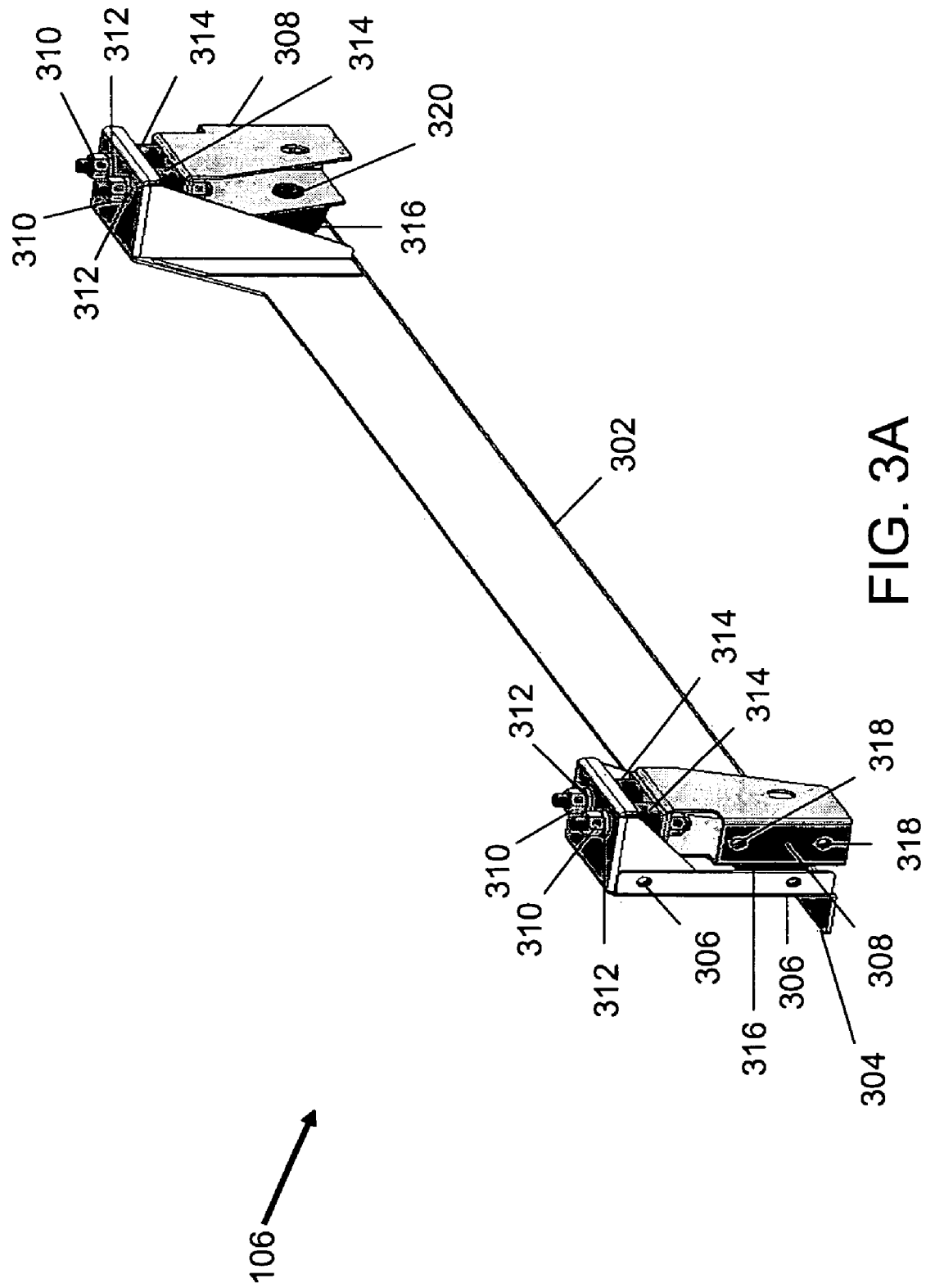
FIG. 3A shows a rail assembly for dampening vibrations in accordance with an embodiment of the present invention.

FIG. 3A shows a rail assembly for dampening vibrations in accordance with an embodiment of the present invention.

Figure 3B:
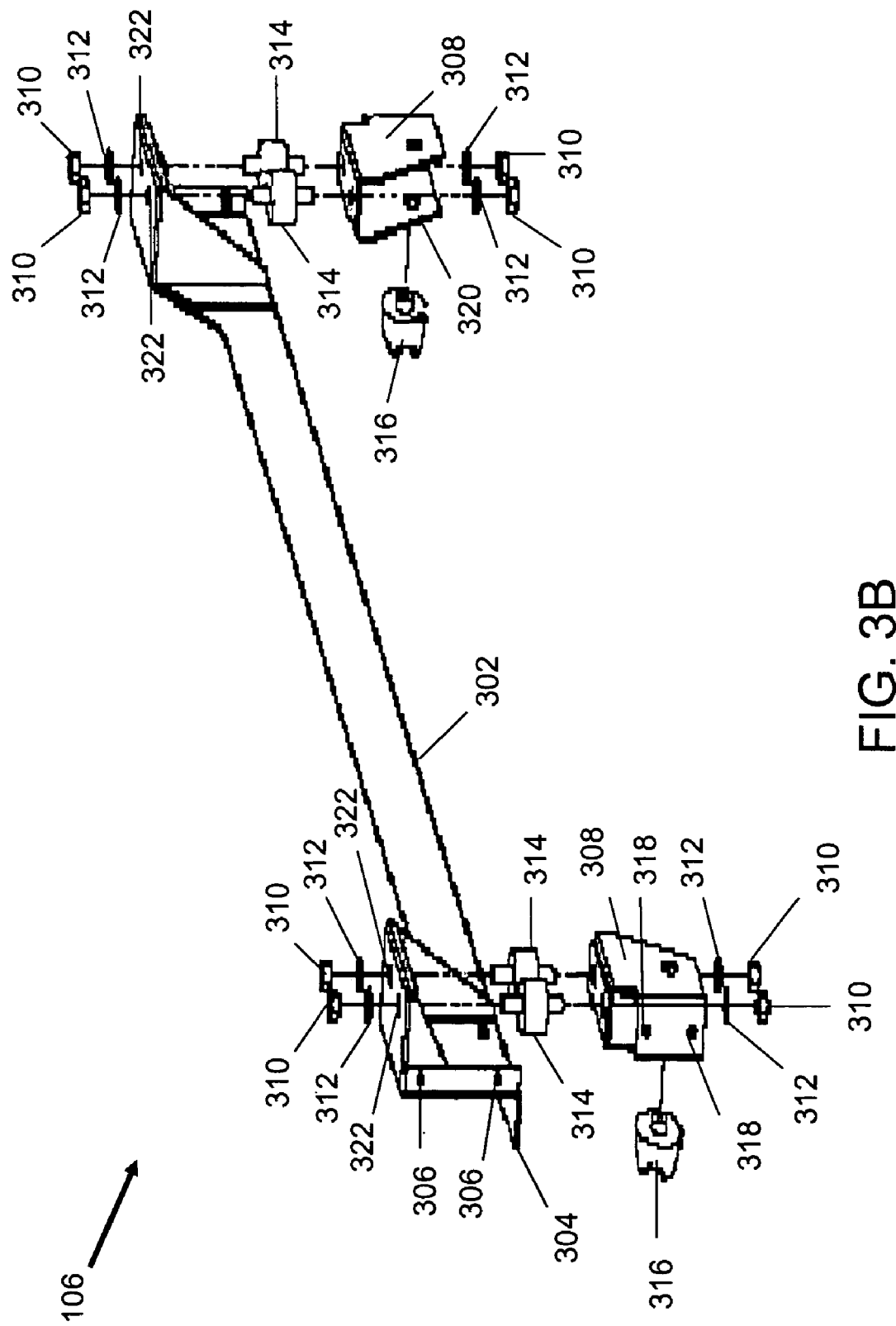
FIG. 3B is an exploded view of the rail assembly in accordance with an embodiment of the present invention.

FIG. 3B is an exploded view of the rail assembly in accordance with an embodiment of the present invention. Rail 302 of rail assembly 106 is made up of a hard metal or any other suitable material depending on the weight of population set 104. For example, rail 302 can be made up of 14-gauge electro-galvanized cold rolled steel. Rail 302 has a horizontal extension 304 from the lowermost surface, to support population set 104. Each end of rail 302 has two holes 306 on the surface, to enable attachment to population set 104. Rail assembly 106 and population set 104 can be attached by means of nuts and screws through holes 306 in rail assembly 106, and holes 210 in population set 104. The plurality of isolators of rail assembly 106 is attached to each end of rail 302 through bracket 308, nuts 310 and lock washers 312.

According to an embodiment of the present invention, the number of isolators can vary, depending on the number of disk drives in population set 104. The plurality of isolators includes two vertically aligned isolators 314 with respect to bracket 308; and one sideways-aligned isolator 316 with respect to bracket 308. Vertically aligned isolators 314 and sideways-aligned isolators 316 are made of different materials. These different materials serve different purposes. Sideways-aligned isolators 316 protect population set 104 from shock. Vertically aligned isolators 314 are for vibration dampening. The location of the isolators is such that two vertically aligned isolators 314 and one sideways-aligned isolator 316 are closest to the points of attachment of population set 104 to rail assembly 106 and the point of attachment of rack 102 to 5 rail assembly. In an embodiment of the present invention, commercially available grommets can be used as isolators. For example, commercially available male-male sandwich mounts of the ISOLOSS™ grommet series manufactured by EAR Speciality Composites can be used as vertically aligned isolators 314. Similarly, mounting feet of the ISODAMP™ AND VERSADAMP™ series manufactured by EAR Speciality Composites can be used as sideways-aligned isolators 316. It will be apparent to anyone skilled in the art that these examples are only for illustrative purposes and in no way limit the scope of the present invention. Vertically aligned isolator 314 is fixed to rail 302 through bracket 308, nut 310 and lock washer 312. Sideways-aligned isolator 316 is bolted to bracket 308 directly. The surface of bracket 308, facing rack 102, has two holes 318 to attach it to rack 102. Rail assembly 106 and rack 102 can be connected by using nuts and screws through holes 318 in rail assembly 106 and holes 112 in population set 104. The surface of bracket 308, facing population set 104, has hole 320 to attach sideways-aligned isolator 316. The top surface of bracket 308 has two holes 322 to attach vertically aligned isolator 314.

FIG. 4A is a side view of a vertically aligned isolator 314 in accordance with an embodiment of the present invention. FIG. 4B is a side view of a sideways-aligned isolator 316 in accordance with an embodiment of the present invention. The dimensions of holes 320 and 322 are suitable for attaching the plurality of isolators to bracket 308.

According to another embodiment of the present invention, the composition of formulating materials of the isolators may vary, depending on the number of disk drives in population set 104 and the amount of isolation required.

According to another embodiment of the present invention, the system of the invention is extensible in horizontal and vertical directions. Rack 102 is extensible in both vertical and horizontal directions. Rack 102 can be extended in the horizontal direction by increasing the number of columns 110 or by any other method. Rack 102 can be extended in the vertical direction by increasing the height of columns 110 or by any other method. According to another embodiment of the present invention, the system of the invention can be suitably used with any four-post cabinet irrespective of the height, width or depth of the cabinet. According to yet another embodiment of the present invention, two rail assemblies 106 are capable of isolating population sets 104 of different sizes. The size of population set 104 depends upon the number of disk drives it carries. Varying the number of disk drives results in change in the dimensions of population set 104. In this embodiment, rail 302 is attached to both rack 102 and population set 104. Two brackets 308, to which the plurality of isolators is bolted, are not attached to rack 102.

The brackets 308 can slide on rail 302. This configuration isolates varying sizes of population set 104 from vibrations at the same time.

The present invention provides a system and method for the isolation of a mass storage device comprising a plurality of disk drives from both internal and external vibrations. This eliminates the need of protecting every individual disk drive from vibrations and shock.

The present invention is suitable for use with a redundant array of independent disks (RAID) based rack-mount systems.

The present invention has been described above with respect to a particular configuration of disk drives, defined as population set 104. However, it will be obvious to one skilled in the art that the invention can apply to any system which supports more than one disk drive. Population set 104 is placed in an operational environment comprising computer servers, or is mounted on or within a mass storage device. The mass storage device can have a rack structure, cabinet structure, or any other supporting structure.

The present invention isolates population set 104 from vibrations in such a way that the disk drives in the population set are packed with optimal density. The present invention enables replacement of individual disk drives from population set 104 without disturbing the other disk drives of the population set. The present invention is extensible in the horizontal and vertical direction, making it flexible for use in mass storage devices.

Although the invention has been discussed with respect to specific embodiments thereof, these embodiments are merely illustrative, and not restrictive, of the invention. For example, a 'system for optimal vibration isolation of disk drives in a data storage device' can include any type of analysis, manual or automatic, to anticipate the needs of a disk drive or set of disk drives at a time of operation. Although the invention has been described primarily with respect to disk drives and other storage devices, aspects of the invention may be provide benefits in other any applications where there are vibration-sensitive devices.

In the description herein for embodiments of the present invention, numerous specific details are provided, such as examples of components and/or methods, to provide a thorough understanding of embodiments of the present invention. One skilled in the relevant art will recognize, however, that an embodiment of the invention can be practiced without one or more of the specific details, or with other apparatus, systems, assemblies, methods, components, materials, parts, and/or the like. In other instances, well-known structures, materials, or operations are not specifically shown or described in detail to avoid obscuring aspects of embodiments of the present invention.

A 'computer' for purposes of embodiments of the present invention may include any processor-containing device, such as a mainframe computer, personal computer, laptop, notebook, microcomputer, server, personal data manager or 'PIM' (also referred to as a personal information manager), smart cellular or other phone, so-called smart card, set-top box, or any of the like.

Reference throughout this specification to "one embodiment", "an embodiment", or "a specific embodiment" means that a particular feature, structure, or characteristic described in connection with the embodiment is included in at least one embodiment of the present invention and not necessarily in all embodiments. Thus, respective appearances of the phrases "in one embodiment", "in an embodiment", or "in a specific embodiment" in various places throughout this specification are not necessarily referring to the same embodiment. Furthermore, the particular features, structures, or characteristics of any specific embodiment of the present invention may be combined in any suitable manner with one or more other embodiments. It is to be understood that other variations and modifications of the embodiments of the present invention described and illustrated herein are possible in light of the teachings herein and are to be considered as part of the spirit and scope of the present invention.

Additionally, any arrows in the drawings/Figures should be considered only as exemplary, and not limiting, unless otherwise specifically noted. Combinations of components or steps will also be considered as being noted, where terminology is foreseen as rendering the ability to separate or combine is unclear.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The foregoing description of illustrated embodiments of the present invention, including what is described in the abstract, is not intended to be exhaustive or to limit the invention to the precise forms disclosed herein. While specific embodiments of, and examples for, the invention are described herein for illustrative purposes only, various equivalent modifications are possible within the spirit and scope of the present invention, as those skilled in the relevant art will recognize and appreciate. As indicated, these modifications may be made to the present invention in light of the foregoing description of illustrated embodiments of the present invention and are to be included within the spirit and scope of the present invention.

Thus, while the present invention has been described herein with reference to particular embodiments thereof, a latitude of modification, various changes and substitutions are intended in the foregoing disclosures, and it will be appreciated that in some instances some features of embodiments of the invention will be employed without a corresponding use of other features without departing from the scope and spirit of the invention as set forth. Therefore, many modifications may be made to adapt a particular situation or material to the essential scope and spirit of the present invention. It is intended that the invention not be limited to the particular terms used in following claims and/or to the particular embodiment disclosed as the best mode contemplated for carrying out this invention, but that the invention will include any and all embodiments and equivalents falling within the scope of the appended claims.

What is claimed is:

1. A system suitable for dampening vibrations in a population set, the population set comprising a plurality of disk drives, the system comprising
    a rail assembly for absorbing vibrations, wherein the rail assembly is coupled to the population set at a point of attachment, wherein the rail assembly is elongated in a first direction;
    a rack for supporting at least one rail assembly;
    a bracket for coupling between the rail assembly and the rack;
    a first isolator coupled between the rail assembly and the bracket substantially near the point of attachment, wherein the first isolator dampens vibrations in a second direction normal to the first direction; and
    a second isolator coupled between the rack and the bracket, wherein the second isolator dampens vibrations in a third direction normal to both the first and second directions, wherein two rail assemblies are attached on opposite faces of the population set.

2. The system according to claim 1, wherein the isolators are made up of different materials.

3. A system suitable for isolating vibrations in a data storage device, the data storage device comprising at least one population set mounted on a rack, the population set comprising a plurality of disk drives, the system comprising:
    a rail assembly for absorbing vibrations, wherein the rail assembly is coupled to the population set at a point of attachment, wherein the rail assembly is elongated in a first direction;
    a bracket for coupling between the rail assembly and the rack;
    a first isolator coupled between the rail assembly and the bracket substantially near the point of attachment, wherein the first isolator dampens vibrations in a second direction normal to the first direction; and
    a second isolator coupled between the rack and the bracket, wherein the second isolator dampens vibrations in a third direction normal to both the first and second directions, wherein the isolators are positioned such that the population set of disk drives is vibrationally isolated from the rail assembly at the point of attachment of the rail assembly to the population set.

4. A method for isolating vibrations in a data storage device, the data storage device comprising a rack and at least one population set coupled to a rail assembly, each population set comprising a plurality of disk drives, the method comprising the steps of:
    attaching the rail assembly to the population set of disk drives at a point of attachment, wherein the rail assembly is elongated in a first direction;
    attaching a first isolator coupled between the rail assembly and a bracket substantially near the point of attachment, wherein the first isolator dampens vibrations in a second direction normal to the first direction;
    attaching a second isolator coupled between the rack and the bracket wherein the second isolator dampens vibrations in a third direction normal to both the first and second directions; and
    attaching two rail assemblies on opposite faces of the population set to allow a maximum number of population sets to be stored in the data storage device.

* * * * *